United States Patent
Cheng et al.

(10) Patent No.: US 8,268,729 B2
(45) Date of Patent: Sep. 18, 2012

(54) SMOOTH AND VERTICAL SEMICONDUCTOR FIN STRUCTURE

(75) Inventors: Kangguo Cheng, Guilderland, NY (US); Bruce B. Doris, Brewster, NY (US); Johnathan E. Faltermeier, Delanson, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1063 days.

(21) Appl. No.: 12/195,691

(22) Filed: Aug. 21, 2008

(65) Prior Publication Data
US 2010/0048027 A1 Feb. 25, 2010

(51) Int. Cl.
*H01L 21/302* (2006.01)
*H01L 21/324* (2006.01)
(52) U.S. Cl. ......... 438/753; 438/150; 438/198; 438/914
(58) Field of Classification Search .................. None
See application file for complete search history.

(56) References Cited

U.S. PATENT DOCUMENTS

| | | | |
|---|---|---|---|
| 6,025,280 A * | 2/2000 | Brady et al. | 438/762 |
| 6,967,175 B1 * | 11/2005 | Ahmed et al. | 438/753 |
| 7,098,477 B2 | 8/2006 | Zhu | 257/66 |
| 7,125,768 B2 * | 10/2006 | Reinberg | 438/257 |
| 7,205,609 B2 | 4/2007 | Lee | 257/346 |
| 7,312,132 B2 * | 12/2007 | Kim | 438/424 |
| 7,410,844 B2 | 8/2008 | Li | 438/156 |
| 7,557,048 B2 * | 7/2009 | Parekh et al. | 438/778 |
| 7,638,381 B2 * | 12/2009 | Cheng et al. | 438/197 |
| 7,754,560 B2 * | 7/2010 | Burnett et al. | 438/212 |
| 7,915,138 B2 * | 3/2011 | Cho et al. | 438/435 |
| 7,947,562 B2 * | 5/2011 | Siprak | 438/372 |
| 8,034,689 B2 * | 10/2011 | Lenoble et al. | 438/283 |
| 2006/0043502 A1 | 3/2006 | Natzle | 257/401 |
| 2006/0049429 A1 | 3/2006 | Kim | 257/213 |
| 2007/0082437 A1 | 4/2007 | Cheng | 438/197 |
| 2007/0117311 A1 | 5/2007 | Zaman | 438/253 |
| 2007/0141763 A1 | 6/2007 | Choi | 438/151 |
| 2007/0167024 A1 * | 7/2007 | Li et al. | 438/753 |
| 2007/0187682 A1 | 8/2007 | Takeuchi | 257/64 |
| 2008/0203468 A1 * | 8/2008 | Cheng et al. | 257/327 |
| 2010/0230776 A1 * | 9/2010 | Gogoi | 257/506 |
| 2011/0201186 A1 * | 8/2011 | Siprak | 438/525 |

* cited by examiner

*Primary Examiner* — Anita Alanko
(74) *Attorney, Agent, or Firm* — George Sai-Halasz; Louis J. Percello

(57) ABSTRACT

A method for processing a semiconductor fin structure is disclosed. The method includes thermal annealing a fin structure in an ambient containing an isotope of hydrogen. Following the thermal annealing step, the fin structure is etched in a crystal-orientation dependent, self-limiting, manner. The crystal-orientation dependent etch may be selected to be an aqueous solution containing ammonium hydroxide ($NH_4OH$). The completed fin structure has smooth sidewalls and a uniform thickness profile. The fin structure sidewalls are {110} planes.

16 Claims, 2 Drawing Sheets

SMOOTH AND VERTICAL SEMICONDUCTOR FIN STRUCTURE

FIELD OF THE INVENTION

The present invention relates to devices used in integrated circuits, and to their manufacturing. More particularly, the present invention relates to improving the performance of FinFET devices.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. One such Si based material of importance for microelectronics is the silicon-germanium (SiGe) alloy. The structures and devices in the embodiments of the present disclosure are typically part of the art of single-crystal Si based material device technology.

There is great difficulty in maintaining performance improvements in devices of deeply submicron generations. Therefore, methods for improving performance without scaling down dimensions have become of interest.

A proposed way to improve device performance at small dimensions is the use of double gated devices. Such a device is not simply a planar structure conducting on one surface, but conducting on two sides of the device body. A variation of the double gated device is the so called FinFET, or Tri-Gate, device. These devices are non-planar, they are three dimensional structures hosted by a fin structure. In FinFETs, the body of the transistor is formed in a fin rising out of a planar background, typically having both vertical and horizontal surfaces. The gate of the FinFET is engaging the top surface, as well as the vertically oriented body surfaces on both faces, or sidewalls, resulting in connected planes being used for transistor channel formation.

SUMMARY OF THE INVENTION

A method is disclosed for processing a semiconductor fin structure. The method includes thermal annealing the fin structure in an ambient containing an isotope of hydrogen. Following the thermal annealing step, the fin structure is etched in a self-limiting manner in a crystal-orientation dependent etch. The crystal-orientation dependent etch may be selected to be an aqueous solution containing ammonium hydroxide ($NH_4OH$).

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
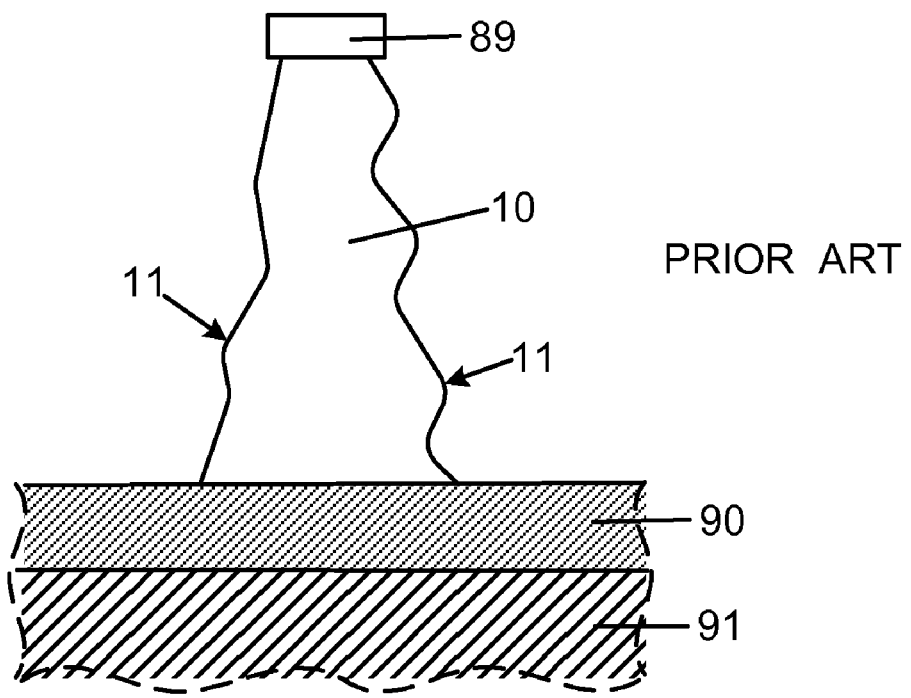
FIG. 1 shows a schematic cross section of a semiconductor fin structure after typical prior art processing.

It is understood that Field Effect Transistors (FETs) are well known in the electronic arts. Standard components of a FET are the source, the drain, the body in-between the source and the drain, and the gate. The body is usually part of a substrate, and it is often called substrate. The gate is overlaying the body and is capable to induce a conducting channel in the body between the source and the drain. In the usual nomenclature, the channel is hosted by the body. The gate is separated from the body by the gate insulator, or dielectric. The FET source and drain are often referred to simply as electrodes. The electrodes adjoin the induced conductive channel and are capable of being in electrical continuity with the induced conductive channel.

A type of FET device known in the art is the so called FinFET device, having a fin-type body. The fin-type body is a fin structure, standing out of a planar surface. Such FET devices, with fin-type bodies, have several advantages as known in the art. In state of the art technologies, the dimensions of fin structures that serve as fin-type device bodies are of a height of about 10 nm to 100 nm, and a thickness of about 5 nm to 50 nm. A higher ratio of height vs. width is typical of FinFET, and a lower height vs. width ratio is typical of Tri-Gate FET.

A fin structure with desired properties has a rectangular cross section. The vertical walls of the fin are supposed to be smooth, preferably smooth on an atomic scale. The reason is that the device channel is induced on these surfaces, and roughness, among other problems, may degrade gate insulator integrity, and degrade carrier transport. It is also desirable for the fin structure to be of a uniform thickness. Any tapering might lead to unwanted device property variations.

A difficulty with FinFET devices is that sidewalls of the fin structure are not smooth enough, and the width of the fin structure is not uniform.

The most common fin structure fabrication involves etching grooves into a semiconductor layer, and the material left in-between the grooves forms the fin structures. The top of the fins is protected in some manner to prevent the removing of material from the fins. There are many techniques know in the art to define the thickness of the fins, for example, by lithography, or by sidewall techniques, or by spacer imaging, or by other techniques. But, in each case the formed fin structure may be short of ideal. Typically, the as fabricated fin has too rough sidewall surfaces, and a non-uniform thickness profile. The term "as fabricated" means that stage of processing when the material between the fins has just been removed, typically by some dry, or wet, etching process.

Embodiments of the present invention introduce two processing steps which take care of the roughness and tapering problems. A thermal annealing with a proper isotope of hydrogen is followed by a self-limiting directional etch, yielding essentially ideal fin structures, well suited for use as fin-type bodies for FET devices.

The processing steps relating to fin structures are understood to be in the framework of general FET/CMOS processing. Manufacturing of FETs is very well established in the art. It is understood that there are a large number of steps involved in such processing, and each step might have practically endless variations known to those skilled in the art. It is further understood that the whole range of known processing techniques and tools are available for the execution of the methods in the embodiments of the present invention.

FIG. 1 shows a schematic cross section of a semiconductor fin structure after typical prior art processing. The fin structure 10 (occasionally referred to as only "fin" for brevity) is of a single-crystal material, typically silicon based. Such silicon based material may be pure Si itself, or various SiGe alloys. The fin structure typically has sidewalls 11, that are coupled, or connected, together by a top surface. In representative embodiment the fin structure is fabricated over a buried oxide layer (BOX) 90. Such BOX layer is typical in the art, but embodiments of the present invention do not depend on the presence of the BOX layer 90. The BOX layer 90 is shown in the figures as an example for a possible embodiment, as the platform supporting the fin could be a semiconductor substrate, or insulator, or metallic substance, or any other without limitation. In the depicted embodiment the BOX layer 90 in over a substrate 91, which is typically Si.

A cap layer 89 is disposed on the top surface of the fin. Such a layer is typically the one which protected, or masked, the fine structure 10 during its formation, when the adjacent material was removed. In subsequent processing the cap layer 89 may be left in place for the same purpose, namely, to protect the top surface of the fin. However, the cap layer 89 present at the stage of processing shown in FIG. 1, is not necessarily the same one used for masking during fin definition steps. A material serving the purposes of such a cap layer 89 may be nitride (silicon nitride). It is understood that although the stoichiometric chemical composition of bulk silicon nitride is $Si_3N_4$, for thin layers used in state of the art microelectronics, such as the cap layer 89, the average composition may not match exactly its supposed bulk, stoichiometric, composition. Accordingly, if the cap layer 89 is of the nitride, its chemical composition is indicated by a more generic SiN.

As it is schematically indicated in FIG. 1, the sidewalls 11 of the fin structure are rough, or coarse. Furthermore, the fin typically is of non-uniform thickness, as it is also depicted. Embodiments of the present invention deal with these problems in two separate steps, which are executed in a proper sequence.

Figure 2:
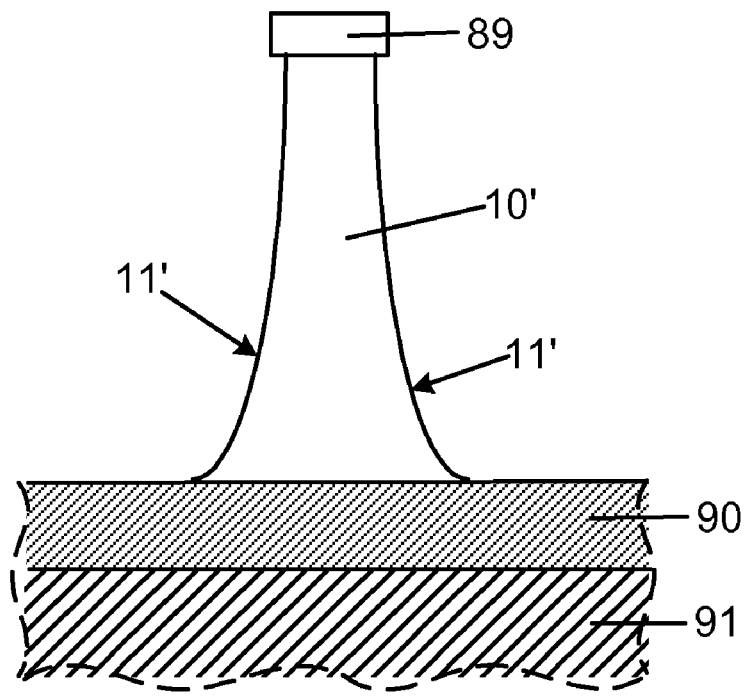
FIG. 2 shows a schematic cross section of the semiconductor fin structure after annealing with an isotope of hydrogen.

FIG. 2 shows the semiconductor fin structure 10' after annealing with an isotope of hydrogen. Henceforth, when reference numbers are primed they indicate the same elements as unprimed, except that the elements may have been successively altered in processing. The element of the embodiment in FIG. 2 are the same as in FIG. 1, but as depicted, the sidewalls 11' are now smooth on an atomic scale. The root-mean-square (rms) deviation after the annealing is less than about 10 atomic layers, or less than about 3 nm, and more typically, less than 3 atomic layers, or less than about 1 nm.

An isotope of hydrogen which yields smoothing of sidewalls 11' may be common hydrogen (H) itself, or deuterium (D), or their mixture. Both hydrogen isotopes are capable of the smoothing action.

Hydrogen (H) being the lightest of elements, readily diffuses into semiconductors. If too much H diffuses into the fin structure 10' during the thermal annealing, the left over H in the fin may potentially interfere with dopant species introduced for tailoring device electrical properties. The deuterium (D) isotope having twice the mass of H, is less ready to diffuse into the semiconductor fin structure, which fact under certain circumstances may be preferable. For this reason the selection for an isotope of hydrogen, may be pure H, or pure D, or their mixture.

The partial pressure of the hydrogen isotope during the thermal annealing can be of a relatively wide range. The choice of pressure depends on initial surface roughness, allowable thermal budged, time constrains, and other parameters. Accordingly, the hydrogen isotope pressure may be anywhere between about 1 mTorr and about 2000 Torr, more likely between about 1 Torr and about 1000 Torr, with typical selection being between about 30 Torr and about 300 Torr. The ambient present during the smoothing anneal in some embodiments may contain essentially the hydrogen isotope only, in alternate embodiment it may also contain inert carrier gases, for instance, nitrogen, argon, xenon, and/or helium.

Selecting the temperature for the smoothing thermal anneal also depends on specific circumstances of the device fabrication. A temperature between about 500° C. and about 1200° C. is adequate, more likely between about 600° C. and about 1100° C., and typically between about 800° C. and about 950° C. The annealing time duration depends on annealing temperature and the partial pressure of the hydrogen isotope. For a representative annealing at 950° C., with a partial pressure of hydrogen of approximately 100 Torr, the annealing time duration may be about 30 seconds.

As it is indicated on FIG. 2, the annealing step leads to smooth sidewalls 11', but it may not lead to a uniform fin thickness in the vertical direction, as various tapered profiles may still be present.

In order to eliminate the non-uniform vertical profile, such as tapering, embodiments of the present invention use a self-limiting directional etch. It was found that for optimal results the proper sequence of steps is such that the thermal annealing with an isotope of hydrogen is performed earlier then the directional etch. The term "earlier" in this connotation means that in the sequence of processing steps the thermal annealing step precedes the directional etching step. The directional etching may, or may not, immediately follow the annealing step. There may be processing steps in-between, which steps however do not limit the scope of the embodiments of the invention.

It is known in the art that there are a variety of etching agents that have very different etch rates depending on the orientation of crystal being etched. On some crystal planes the etching may essentially stop, while planes of different orientation may be speedily etched. The ending of such directional etching may be self limitation, wherein the etch stops by itself when the slowly etching crystal planes are the only ones remaining, as the other orientations have already been consumed.

An aqueous solution containing ammonium hydroxide ($NH_4OH$) has the property that it has a very slow etch rate, less than about 1 nm per second, when etching the {110} planes of silicon, and in general those of silicon based materials. On the other hand, the same solution has a much higher etch rate, at least 20 times greater, when etching {100} planes. The notation of planes follows standard Miller indices notation, for instance, {110} meaning a collection of planes of [110] orientation.

Figure 3:
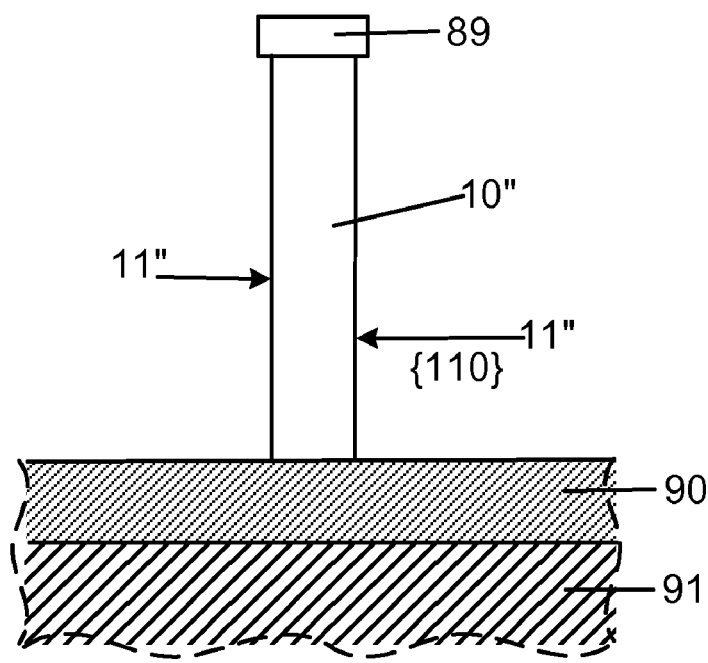
FIG. 3 shows a schematic cross section of the semiconductor fin structure after etching in a crystal-orientation dependent manner.

FIG. 3 shows the semiconductor fin structure 10" after etching in a crystal-orientation dependent manner. The fin structure 10" definition, resulting in the profile shown in FIG. 1, was already executed in such a manner to make the sidewalls substantially parallel to {110} crystallographic planes. With this basic orientation, after removing the surface roughness with the thermal annealing step, the crystal-orientation dependent etch, which essentially stops on the {110} planes, corrects the thickness non-uniformity. The etch is self-limiting in that it substantially stops when only the {110} planes are being exposed. The {110} planes are perfectly perpendicular to the top surface plane, which in typical applications is a [100] plane. The result is the desired smooth and vertical fin structure depicted in FIG. 3, where the sidewalls 11" are {110} planes.

In representative embodiments of the invention, aqueous solution containing ammonium hydroxide (NH$_4$OH) may be applied to the fin structure 10' in a broad temperature range. A temperature between about 0° C. and about 100° C. is adequate, more likely between about 15° C. and about 85° C., and typically between about 25° C. and about 65° C. The water to ammonium hydroxide ratio, H$_2$O:NH$_4$OH, in the aqueous solution can be between about 10:1 to about 200:1, more likely between about 20:1 to about 100:1, and typically about 50:1. The etch time duration is not critical, since as described already, the etching is self-limiting.

Alternate solutions that may be contemplated to replace the aqueous solution containing ammonium hydroxide, having similar effects, may be selected from potassium hydroxide (KOH), tetramethylammonium hydroxide (TMAH), hydrazine, or ethylene diamine pyrocatechol (EDP).

Figure 4:
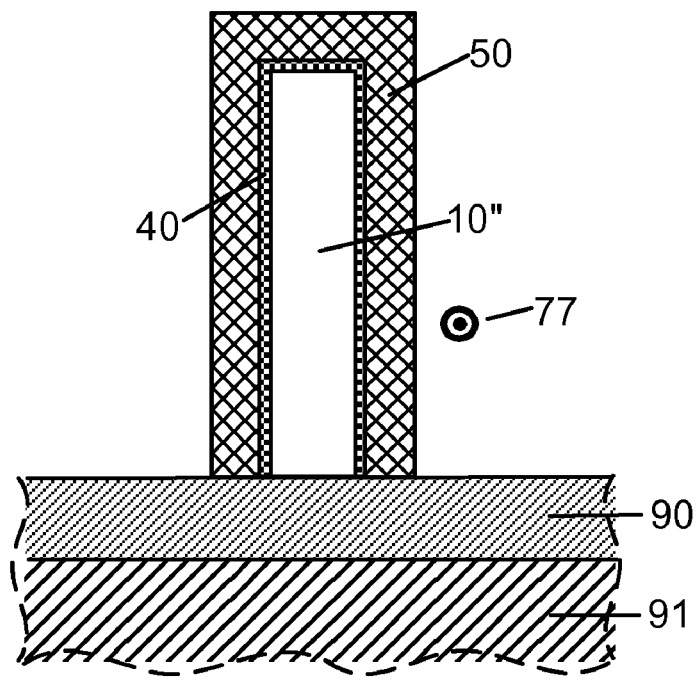
FIG. 4 shows a schematic cross section of a FinFET device fabricated with a smooth and vertical fin-type body.

FIG. 4 shows a schematic cross section of a FinFET device fabricated with a smooth and vertical fin-type body. As known in the art, Si FET devices with fin-type bodies are characterized as being silicon FinFET devices. After the processing shown in FIG. 2 and FIG. 3, the fin structure is ideally suited to be incorporated into a FET device, as a fin-type body. The figure gives a cross section of the FinFET at its mid-section. "FinFET" being the name that FET devices with fin-type 10" bodies are being referred to. The current in the FET device is flowing in the direction perpendicular to the cross sectional plane, as the current flow direction 77 is schematically indicated. As it is known in the art, in FinFETs a gate insulator 40 is disposed over the fin-type structure 10", and a gate 50 is laying over the gate insulator 40. The FinFET device is depicted in a SOI embodiment. The device is over a BOX layer 90, which is supported by a substrate 91. However, such depiction does not intend to be limiting, other substrate structures, for instance, a bulk substrate is similarly adequate.

The material of the fin structure 10" and consequently of the fin-type device body, as discussed earlier, is silicon based, for instance SiGe, single-crystal material. In representative embodiments of the invention the fin structure 10" is essentially Si.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under", "over", "top", "side", "on", "vertical", "perpendicular", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

We claim:

1. A method for processing a fin structure, comprising the steps of:
    thermal annealing said fin structure in an ambient containing an isotope of hydrogen;
    etching said fin structure in a crystal-orientation dependent manner, wherein said thermal annealing step is performed earlier than said etching step; and
    wherein said fin structure has sidewalls and said fin structure is composed of a semiconductor material, and wherein during both of said thermal annealing and etching steps said semiconductor material is exposed on said sidewalls.

2. The method of claim 1, further comprising the steps of:
    forming said sidewalls to be substantially parallel to {110} crystallographic planes;
    performing said etching step with an aqueous solution containing ammonium hydroxide (NH$_4$OH).

3. The method of claim 1, wherein said method further comprises selecting said isotope of hydrogen to be hydrogen (H).

4. The method of claim 1, wherein said method further comprises selecting said isotope of hydrogen to be a hydrogen (H) deuterium (D) mixture.

5. The method of claim 1, wherein said method further comprises selecting said isotope of hydrogen to be deuterium (D).

6. The method of claim 1, wherein said method further comprises selecting a pressure for said isotope of hydrogen to be between about 30 Torr and about 300 Torr.

7. The method of claim 1, wherein said method further comprises performing said thermal annealing between about 500° C. and about 1200° C.

8. The method of claim 7, wherein said method further comprises performing said thermal annealing between about 800° C. and about 950° C.

9. The method of claim 1, wherein said fin structure further comprises a top surface, with said top surface coupling said sidewalls, wherein said method further comprises disposing a cap layer over said top surface.

10. The method of claim 9, wherein said method further comprises selecting said cap layer to be of silicon nitride.

11. The method of claim 1, wherein said method further comprises selecting said semiconductor material to be a single-crystalline silicon-based material.

12. The method of claim 11, wherein said method further comprises fabricating said fin structure over a buried oxide layer (BOX).

13. A method for fabricating a field effect transistor (FET), comprising:
    processing a fin body for said FET, said processing comprises:
        thermal annealing said fin body in an ambient containing an isotope of hydrogen;
        etching said fin body in a crystal-orientation dependent manner, wherein said thermal annealing is performed earlier than said etching; and
        wherein said fin body has sidewalls and said fin body is composed of a semiconductor material, and wherein during both of said thermal annealing and etching steps said semiconductor material is exposed on said sidewalls.

14. The method of claim 13, further comprising:

forming said sidewalls to be substantially parallel to {110} crystallographic planes; and performing said etching with an aqueous solution containing ammonium hydroxide (NH$_4$OH).

15. The method of claim 13, wherein said method further comprises performing said thermal annealing between about 800° C. and about 950° C.

16. A method for fabricating a field effect transistor (FET), comprising:

processing a fin body for said FET, wherein said fin body has sidewalls, wherein said sidewalls are substantially parallel to {110} crystallographic planes;

thermal annealing said fin body at a temperature of between about 600° C. and about 1100° C., in an ambient containing an isotope of hydrogen, and at a pressure of between about 1 Torr and about 1000 Torr;

etching said in fin body in an aqueous solution containing ammonium hydroxide (NH$_4$OH), wherein said thermal annealing is performed earlier than said etching; and wherein said fin body is composed of a semiconductor material, and wherein during both of said thermal annealing and etching steps said semiconductor material is exposed on said sidewalls.

* * * * *